(12) United States Patent
Matsuse et al.

(10) Patent No.: US 6,838,376 B2
(45) Date of Patent: Jan. 4, 2005

(54) METHOD OF FORMING SEMICONDUCTOR WIRING STRUCTURES

(75) Inventors: Kimihiro Matsuse, Inagi (JP); Hayashi Otsuki, Nakakoma-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/530,588

(22) PCT Filed: Nov. 5, 1998

(86) PCT No.: PCT/JP98/04983

§ 371 (c)(1),
(2), (4) Date: May 5, 2000

(87) PCT Pub. No.: WO99/23694

PCT Pub. Date: May 14, 1999

(65) Prior Publication Data

US 2003/0034560 A1 Feb. 20, 2003

(30) Foreign Application Priority Data

Nov. 5, 1997 (JP) .............................................. 9-319059
Jul. 7, 1998 (JP) ........................................... 10-207198

(51) Int. Cl.⁷ .............................................. H01L 21/44
(52) U.S. Cl. ........................ 438/653; 438/656; 438/680; 438/683; 438/685
(58) Field of Search ................................ 438/643, 648, 438/649, 653, 655, 656, 680; 257/412, 413, 754, 755, 756, 764, 751

(56) References Cited

U.S. PATENT DOCUMENTS 4,847,111 A * 7/1989 Chow et al. ................. 438/592
5,010,032 A    4/1991 Tang et al.
5,066,615 A   11/1991 Brady et al.

(List continued on next page.)

FOREIGN PATENT DOCUMENTS

| JP | 62-188268 | 8/1987 | |
| JP | 64-5015 | 1/1989 | |
| JP | 5-129231 | 5/1993 | |
| JP | 8-293604 | 11/1996 | |
| JP | 9-186102 | 7/1997 | |
| JP | 9-186102 A | * 7/1997 | ........... H01L/21/28 |
| JP | 9-199445 | 7/1997 | |
| JP | 9-260306 | 10/1997 | |
| JP | 9-260306 A | * 10/1997 | ......... H01L/21/285 |
| JP | 10-209073 | 8/1998 | |
| JP | 10-294314 | 11/1998 | |
| JP | 11-26394 | 1/1999 | |
| JP | 11-26757 | 1/1999 | |
| WO | WO96/17104 | 6/1996 | |

OTHER PUBLICATIONS

Wolf, S., Silicon Processing for the VLSI Era, vol. 2, Lattice Press, 1990, pp. 192–193, 587–591.*
Kasai et al., WM/Nx/Poly–Si Gate . . . , IEEE IEDM Tech. Digest, Dec. 1994, pp. 497–500.*
Supplementary European Search Report EP 98 95 1697.

*Primary Examiner*—T. N. Quach
(74) *Attorney, Agent, or Firm*—Oblon, Spivak, McClelland, Maier & Neustadt, P.C.

(57) ABSTRACT

A method of forming a barrier metal film formed of a nitride film including tungsten by thermal CVD. The method includes positioning a substrate in a processing vessel and forming a WSi film on one side of the substrate by supplying a process gas including $WF_6$ gas and at least one of $SiR_4$ gas, $SiH_2Cl_2$ gas and $Si_2H_6$ gas into the processing vessel while a processing pressure in the processing vessel is maintained. The method also includes shutting off the supplying of the process gas into the processing vessel and completely removing the process gas from the processing vessel by supplying a purging gas into the processing vessel after the shutting off the supplying. The WSi film is nitrided by supplying $NH_3$ gas or MMH gas into the processing vessel from which the process gas has been removed, to form a WSixNy film.

16 Claims, 4 Drawing Sheets

U.S. PATENT DOCUMENTS

| | | | |
|---|---|---|---|
| 5,106,786 A | | 4/1992 | Brady et al. |
| 5,134,451 A | * | 7/1992 | Katoh ........................ 257/412 |
| 5,796,166 A | * | 8/1998 | Agnello et al. ............. 257/751 |
| 5,817,572 A | * | 10/1998 | Chiang et al. .............. 438/624 |
| 5,880,526 A | * | 3/1999 | Hatano et al. .............. 257/763 |
| 5,888,588 A | | 3/1999 | Nagabushnam et al. . 427/248.1 |
| 5,916,634 A | | 6/1999 | Fleming et al. |
| 5,962,904 A | * | 10/1999 | Hu ............................. 257/412 |
| 6,051,492 A | * | 4/2000 | Park et al. .................. 438/637 |
| 6,060,361 A | * | 5/2000 | Lee ............................. 438/283 |
| 6,084,279 A | * | 7/2000 | Nguyen et al. ............. 257/412 |
| 6,096,630 A | * | 8/2000 | Byun et al. .................. 438/592 |
| 6,103,607 A | * | 8/2000 | Kizilayalli et al. ......... 438/588 |
| 6,536,460 B1 | * | 3/2003 | Yelverton et al. ........... 137/240 |
| 6,573,184 B2 | | 6/2003 | Park |
| 6,602,784 B2 | | 8/2003 | Sneh |
| 6,656,835 B2 | | 12/2003 | Marsh et al. |
| 2001/0034123 A1 | | 10/2001 | Jeon et al. |

* cited by examiner

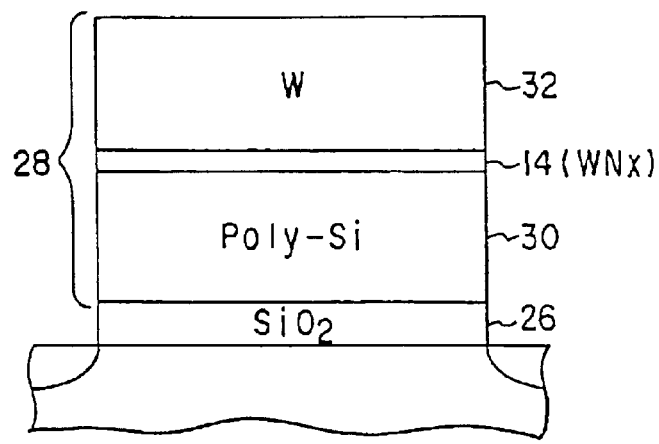
FIG. 7
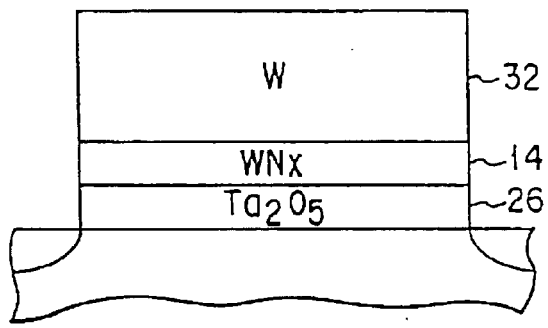
FIG. 8
| | COMPARATIVE EXAMPLE 1 | COMPARATIVE EXAMPLE 2 | PRESENT INVENTION |
|---|---|---|---|
| STRUCTURE | Poly / WSi | Poly / TiSi | Poly / WN / W |
| RESISTANCE VALUE (uohmcm) | 50-60 | 20-30 | 10 |
| HEAT RESISTANCE (°C) | 1000 | 800 | 900 |
| CHEMICAL RESISTANCE (HF) | GOOD | POOR | GOOD |
| ETCHING AMOUNT DURING FILM FORMATION | LARGE | SMALL | SMALL |
FIG. 9 ic devices such as a semiconductor integrated circuit, film-
METHOD OF FORMING SEMICONDUCTOR WIRING STRUCTURES

TECHNICAL FIELD

The present invention relates to a wiring structure and an electrode of a semiconductor device, and a method of manufacturing the same.

BACKGROUND ART

Generally, to manufacture a semiconductor integrated device such as a semiconductor integrated circuit, film-formation, oxidative diffusion, etching and the like are repeatedly applied onto a semiconductor wafer to form numeral transistors, capacitors, and resistances, and thereafter these elements are connected with a wiring pattern. Furthermore, since the development of a high-performance integrated circuit and a multi-functional integrated circuit has been demanded, a further reduction of wiring width and higher integration of the elements are demanded. Moreover, a multi-layered structure has come to be employed in which circuits themselves are stacked one upon the other with an insulating layer interposed between them.

Since a sectional area of the wiring and a connecting portion is reduced under these circumstances, there is a tendency of increasing resistance. It follows that, as a wiring material, copper tends to be used in place of aluminium used generally at present. This is because copper is highly resistant to electromigration and its resistivity is relatively low even though form-formation is not so easy as aluminum.

Usually, as a gate electrode used in a transistor element, a doped polysilicon layer is used alone or a double layered structure electrode is used which is formed by stacking a molybdenum silicide layer or a tungsten silicide layer on the doped polysilicon layer. However, to further reduce the resistivity, an attempt has been made to replace upper silicide layer of the double-layered gate electrode with a single metal layer, for example, a tungsten layer.

Incidentally, copper and tungsten themselves are highly active metals, so that they are likely to react with other elements. For example, metal copper has a large diffusion coefficient, so that it diffuses and segregates into Si, $SiO_2$ or the like, causing defects. As a result, not only resistance value increases but also exfoliation occurs.

When a metal tungsten film is used as one of the layers of the gate electrode of the double layered structure, the silicon atoms of the lower doped polysilicon layer and tungsten of the upper metal tungsten layer are mutually diffused and react with each other to produce tungsten silicide having a large resistivity.

To prevent the reaction between the metal copper and the metal tungsten, it is possible to use a barrier metal such as TiN (titanium nitride) as conventionally used. However, the TiN layer is not a preferable barrier metal because affinity, in other words, adhesiveness, with the metal copper film and the metal tungsten film, is not satisfactory.

Recently, the semiconductor integrated circuit has been desired to be formed in more integrated and more multi-layered structure and operated at a higher speed. To satisfy these demands, it is required to reduce a resistivity of a gate electrode, for example, by reducing the thickness of individual layers and to increase an aspect ratio (a high aspect ratio) during etching processing.

However, if the thickness of a tungsten film constituting the gate electrode is reduced, the tungsten film degrades in adhesiveness to an underlying layer, for example, the polysilicon layer, and in heat resistance. It is also possible herein that a conventionally known TiN film is interposed between both layers as a barrier metal. However, in this case, the adhesiveness between the TiN film and the polysilicon film at the interface degrades, causing exfoliation.

DISCLOSURE OF THE INVENTION

An object of the present invention is to provide a wiring structure and an electrode of a semiconductor device including a barrier metal which is effective for a metal copper film and a metal tungsten film, and to provide a method of manufacturing the same. Another object of the present invention is to provide a gate electrode excellent in characteristics even if the thickness is reduced and a method of manufacturing the same.

To attain the aforementioned object, the wiring structure of the semiconductor device according to the present invention comprises a first conducting layer electrically connected to a semiconductor element or a wiring element formed on a semiconductor substrate;

a barrier metal formed on the first conducting layer; and a second conducting layer formed on the barrier metal and electrically connected to the first conducting layer via the barrier metal;

in which the barrier metal is formed of $WN_x$ (tungsten nitride) or $WSi_xN_y$ (tungsten silicide nitride).

Furthermore, the present invention is directed to an electrode of a circuit element formed on a semiconductor substrate, comprising a polysilicon layer, a barrier metal formed on the polysilicon layer and a metal layer formed on the barrier metal, in which the barrier metal is formed of $WN_x$ (tungsten nitride) or $WSi_xN_y$ (tungsten silicide nitride).

The present invention is directed to a method of manufacturing a wiring structure of a semiconductor device, forming a first conducting layer by depositing a metal film on an insulating film of the semiconductor device;

forming an interlayer insulating film over an entire surface of the semiconductor substrate so as to cover the first conducting layer from the above;

forming a connecting hole at a predetermined position of the interlayer insulating film so as to pass the interlayer insulating film and reach the first conducting layer;

forming a barrier metal of $WN_x$ (tungsten nitride) or $WSi_xN_y$ (tungsten silicide nitride) from an inner surface of the connecting hole to a surface of the first conducting layer exposed in a bottom portion of the connecting hole; and depositing a metal film on the barrier metal and simultaneously fill the connecting hole with the metal film, thereby forming a second conducting layer electrically connected with the first conducting layer via the barrier metal.

Furthermore, the present invention is directed to a method of forming a gate electrode of a transistor formed on a semiconductor substrate, comprising forming a polysilicon layer on a gate oxide film formed between a source and a drain of the transistor;

forming a barrier metal of $WN_x$ (tungsten nitride) or $WSi_xN_y$ (tungsten silicide nitride), thereby forming a metal layer on a barrier metal.

BRIEF DESCRIPTION OF THE DRAWINGS

FIG. 7 is an enlarged view showing a part of the electrode shown in FIG. 3.

FIG. 8 is an enlarged sectional view of a gate electrode using $Ta_2O_5$ as a gate oxide film.

FIG. 9 is data for comparing the gate electrode according to the present invention to a conventional gate electrode.

BEST MODE FOR CARRYING OUT THE INVENTION

Now, embodiments of the present invention will be explained with reference to the drawings.

Figure 1:
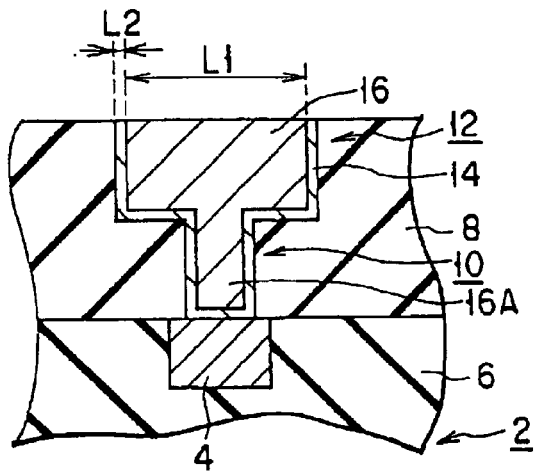
FIG. 1 is an enlarged sectional view showing a barrier metal applied to Cu dual damashine wiring.
Figure 2:
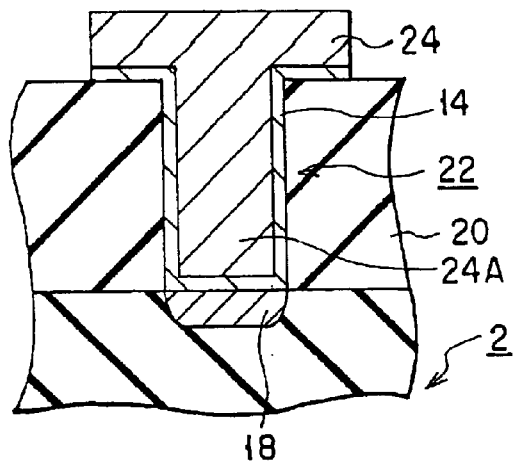
FIG. 2 is an enlarged sectional view showing a barrier metal applied to a contact hole.
Figure 3:
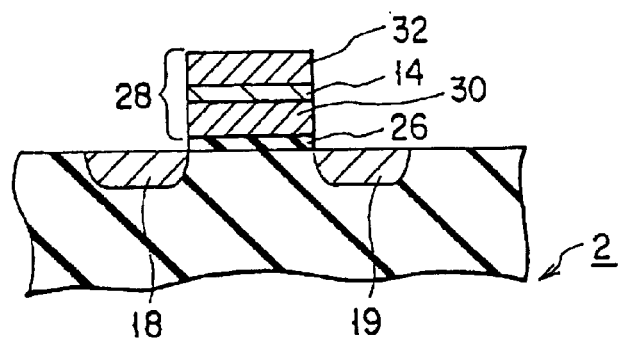
FIG. 3 is an enlarged sectional view showing a barrier metal applied to a gate electrode.
Figure 4:
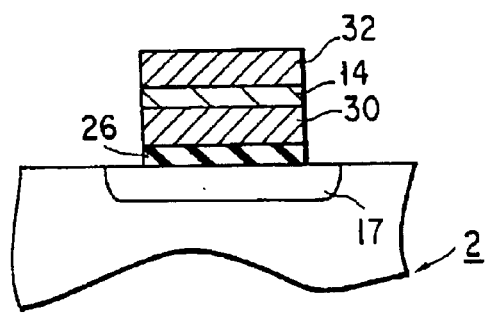
FIG. 4 is an enlarged sectional view showing a barrier metal applied to a capacitor electrode.

FIG. 1 is an enlarged sectional view showing a barrier metal applied to Cu dual damashine wiring. FIG. 2 is an enlarged sectional view showing a barrier metal applied to a contact hole. FIG. 3 is an enlarged sectional view showing a barrier metal applied to a gate electrode. FIG. 4 is an enlarged sectional view showing a barrier metal applied to a capacitor electrode.

The dual damashine process for forming Cu dual damashine wiring as shown in FIG. 1 is used for the multi-layered structure of wiring to attain a high-performance and multi-functional device in a semiconductor integrated device, namely, a semiconductor integrated circuit. More specifically, in the case where wiring is formed in the multi-layered structure, an upper layer wiring element is connected to a lower layer wiring element. At this time, this process makes it possible to form wiring and via-plug simultaneously, with the result that the number of steps, and the cost for wiring can be successfully reduced, and the aspect ratio can be successfully high.

In FIG. 1, reference numeral 2 is, for example, a substrate such as a semiconductor wafer, a reference numeral 4 is a lower-layer wiring element (conducting layer) formed on a surface of the substrate 2. The lower-layer wiring element 4 is insulated by, for example, $SiO_2$ insulating film 6 formed therearound. The lower-layer wiring 4 is formed of, for example, a metal copper thin film. Reference numeral 8 is an interlayer insulating film made of $SiO_2$ formed by SOG (Spin On Glass) so as to cover the $SiO_2$ insulating film 6 and the lower-layer wiring element 4. The interlayer insulating film 8 is formed by coating in accordance with SOG as mentioned above, so that a relatively large number of oxygen molecules are contained.

Reference numeral 10 is a via-hole formed in the interlayer insulating film 8 so as to expose a part of the lower-layer wiring element 4. Reference numeral 12 is a wiring groove formed in the surface of the interlayer insulating film 8. Reference numeral 14 is a thin barrier metal of $WN_x$ (tungsten nitride; x=0.5–1) or $WSi_xN_y$ (tungsten silicide nitride; x=0.01–0.2, y=0.02–0.2) according to the present invention. The barrier metal is formed on an inner wall surface of the via-hole 10 and on an inner wall surface of the wiring groove 12. Reference numeral 16 is an upper layer wiring element (conducting layer) formed of, for example, a metal copper. When the wiring is formed, the via-hole 10 is filled with the metal copper, with the result that a via-hole plug 16A is simultaneously formed.

In this case, the width L1 of the wiring element 16 is 1 μm or less, for example, about 0.2 μm. The thickness L2 of the barrier metal 14 is from about 0.005 to 0.05 μm.

As described in the above, in the dual damashine process, since the thin barrier metal 14 formed of $WN_x$ or $WSi_xN_y$ is interposed between the upper-layer wiring element 16 made of a copper thin film and the interlayer insulating film 8 formed by SOG, and between the via-hole plug 16A made of metal copper and the interlayer insulating film 8 formed by SOG, metal copper of the via-plug 16A and the upper-layer wiring element 16 cannot be diffused into the interlayer insulating film 8. It is therefore possible to prevent the occurrence of segregation and defects. Therefore, the resistance of the via-hole plug 16A and the upper-layer wiring element 16 can be maintained at a low value. In addition, since the adhesiveness does not degrade, it is possible to prevent the metal copper from peeling off.

In the modified example thus constituted, either one of the lower-layer wiring element 4 and the upper-layer wiring element 16 is formed of any one of Al, W, and Cu. The other one of the lower-layer wiring element 4 and the upper-layer wiring element 16 is formed of W or Cu.

FIG. 2 is a view showing the barrier metal of the present invention applied to a contact hole. In the figure, reference numeral 18 is a source or a drain (conducting layer) of a transistor formed in the substrate 2. Explanation will be made by regarding reference numeral 18 as the source. Reference numeral 20 is an interlayer insulating film which covers the entire transistor including the source 18, thereby insulating it. The insulating film 20 is formed of a $SiO_2$ film formed by SOG in the same manner explained in FIG. 1. Reference numeral 22 is a contact hole to expose the surface of the source 18 therein. On the inner wall surface of the contact hole and the upper surface of the interlayer insulating film 20, a thin barrier metal 14 made of $WN_x$ or $WSi_xN_y$ according to the present invention is formed. The contact hole 22 is filled with a contact hole plug 24A made of metal copper, and simultaneously, metal copper is stacked on the upper portion. The metal copper is then subjected to pattern etching to thereby form a wiring element (conducting layer) 24.

Note that, in the figure, the barrier metal 14 on the interlayer insulating film 20 is pattern-etched.

In this case, since the thin barrier metal 14 made of $WN_x$ or $WSi_xN_y$ is interposed between the interlayer insulating film 20 made of $SiO_2$ and the contact hole plug 24A made of metal copper, and between the interlayer insulating film 20 and the wiring element 24, it is possible to prevent the metal copper from diffusing into the interlayer insulating film 20. Therefore, it is possible to prevent the occurrence of segregation and defects of the metal copper constituting these elements. It is therefore possible not only to maintain a low resistivity but also to prevent the deterioration of adhesiveness, with the result that exfoliation can be prevented.

In the aforementioned structure, the drain or source 18 is formed of silicon (Si). The wiring 24 may be formed of Al or W.

FIG. 3 is a view of the barrier metal of the present invention applied to the gate electrode. In the figure, reference numerals 18, 19 are respectively a source and a drain of the transistor device formed in the surface of the substrate 2. A thin gate oxide film 26 is formed between these. A gate electrode 28 is formed on the gate oxide film 26. The gate electrode 28 is formed in a three layered structure by stacking, for example, a phosphorus-doped polysilicon layer 30, a thin barrier metal 14 of $WN_x$ or $WSi_xN_y$, and a metal layer 32 of tungsten, in the order from the bottom.

In this case, since the barrier metal 14 of the present invention is interposed between the polysilicon layer 30 and the metal layer 32, it is possible to prevent silicon atoms of the polysilicon layer 30 and metallic atoms of the metal layer 32 from diffusing each other. As a result, it is possible to not only prevent the metal layer 32 from being converted into a silicide but also prevent formation of pits (vacant holes) that the resistance of the metal layer 32 can be prevented from increasing and exfoliation of the metal layer 32 can be prevented.

In the aforementioned structure, the metal layer 32 may be formed of Cu. The gate oxide film 26 is formed of any one of $SiO_2$, SiOF, $Ta_2O_5$ and $CF_x$ (x=1–4).

FIG. 4 shows a structure of a capacitor to which the barrier metal of the present invention is applied.

A diffusion layer 17 serving as one of the electrodes of the capacitor is formed in the surface of the substrate 2. On the diffusion layer 17, a thin insulating layer 26 is formed as a dielectric layer of the capacitor. On the thin insulating layer 26, a three layered structure of the polysilicon 30/barrier metal 14/metal layer (W) 32 is formed as the other electrode of the capacitor. The barrier metal 14 is formed of $WN_x$ or $WSi_xN_y$. With this structure, the metal layer 32 is not converted into a silicide, so that an increase in resistivity is prevented. In addition, the exfoliation of the metal layer 32 can be prevented.

In this case, since the barrier metal 14 of the present invention is interposed between the polysilicon layer 30 and the metal layer 32, it is possible to prevent metal atoms of the metal layer 32 from diffusing into the polysilicon layer 30 by the presence of the barrier metal 14. As a result, it is possible to prevent the metal layer 32 from being converted into a metal silicide layer. It follows that the resistivity of the metal layer 32 is prevented from decreasing and exfoliation of the metal layer 32 is prevented.

In the aforementioned structure, the metal layer 32 may be formed of Cu or Al. The gate oxide film 26 may be formed of any one of $SiO_2$, SiOF, $Ta_2O_5$, and $CF_x$ (x=1–4).

Next, we will explain a method of forming the aforementioned wiring structure and electrode.

Figure 5:
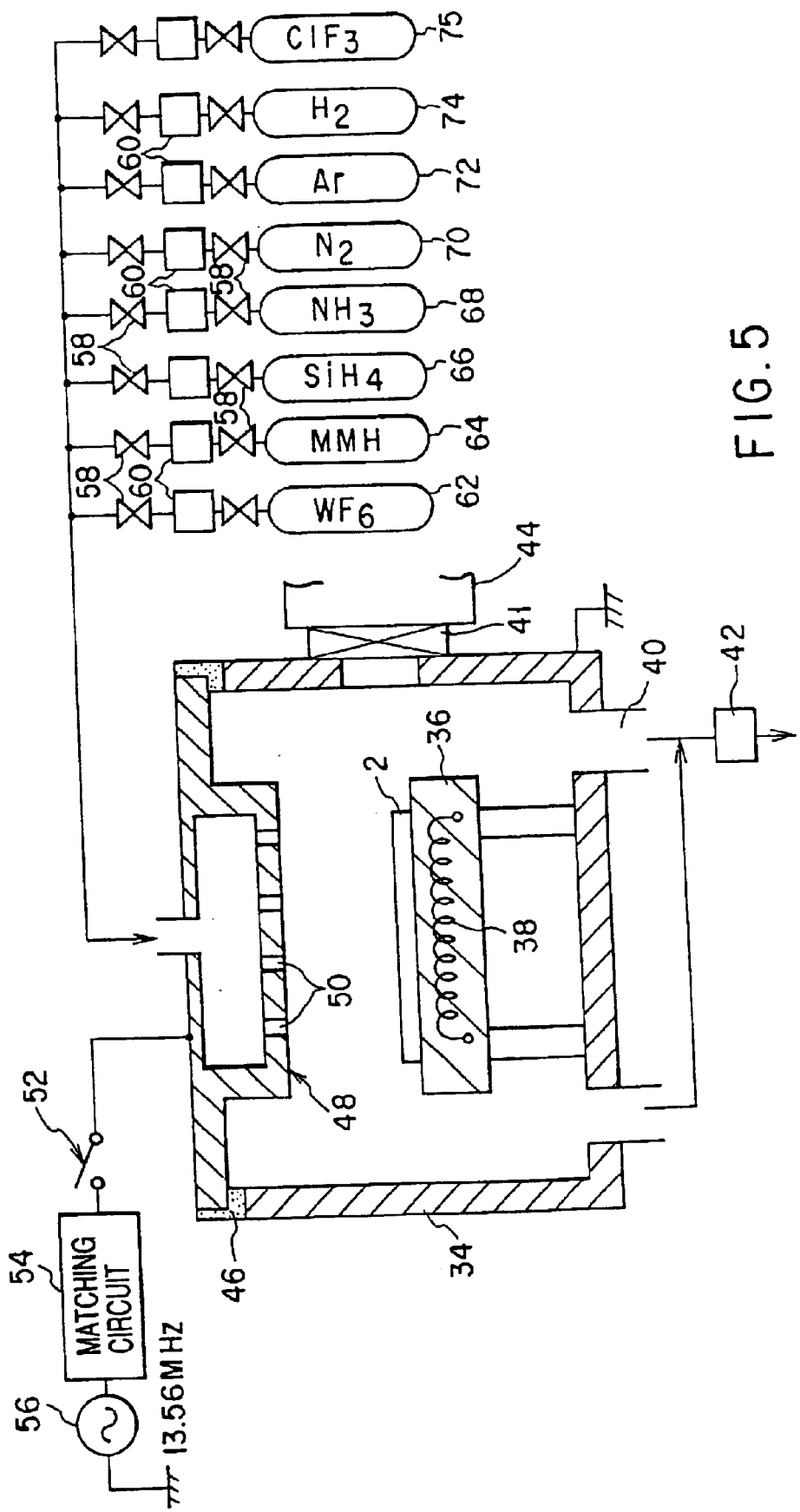
FIG. 5 is a schematic structural view showing a processing apparatus for forming a barrier metal.

FIG. 5 is a view showing a schematic structure of a processing apparatus for forming the barrier metal. The processing apparatus will be first explained. As shown in the figure, the processing apparatus has a cylindrical shape processing vessel 34 made of aluminium. In the vessel 34, a mounting pedestal 36 is arranged for mounting the substrate 2 thereon. Within the mounting pedestal 36, a heater 38 is provided for heating the substrate 2 to a predetermined process temperature. Note that a heating lamp may be provided in a lower portion of the processing vessel to heat the substrate 2 by the lamp.

The processing vessel 34 and the mounting pedestal 36 are individually grounded. The mounting pedestal 36 also serves as a lower electrode when a high frequency is used. At the bottom of the processing vessel 34, an exhaust port 40 is provided. To the exhaust port 40, a vacuum exhaust system is connected by way of a vacuum pump 42. To the side wall of the processing vessel 34, a loadlock chamber 44 is connected via a gate valve 41 for transferring the substrate 2 to/from the processing vessel 34.

At the upper portion of the processing vessel 34, a shower head portion 48 having numerous gas spray holes 50 is provided via an insulating material 46. To the shower head portion 48, a high frequency power source 56 of, for example, 13.56 MHz is connected by way of a switch 52 and a matching circuit 54. If a high frequency power is applied, if necessary, to the shower head portion 48 to use it as an upper electrode, plasma processing can be performed. The method for applying a plasma is not limited to this. The high frequency power may be applied to a lower electrode, and alternatively, applied to both upper and lower electrodes.

Furthermore, a plurality of gas sources are connected to the shower head portion 48 via an open/shut valve 58 and a mass flow controller 60. As a gas source, a $WF_6$ source 62, a MMH (monomethylhydrazine) source 64, a $SiH_4$ (silane) source 66, an $NH_3$ source 68, a $N_2$ source 70, an Ar source 72, a $H_2$ source 74, a $ClF_3$ source 75 are provided in accordance with different purposes and selectively used. Furthermore, in place of $SiH_4$ gas, disilane ($Si_2H_4$) or dichlorosilane ($SiH_2Cl_2$) may be used.

Then, a method of forming the wiring structure of the present invention using the device constituted as mentioned above will be explained more specifically.

The method of forming the wiring structure of the present invention includes a method of forming the barrier metal at a stretch in one step. Herein below, the method will be explained successively. In this text, a case where dual damashine wiring (refer to FIG. 1) is formed by the aforementioned Cu dual damashine process will be explained as an example. Note that in the case where the barrier metal is applied to a contact hole, the method of forming the barrier metal is completely the same although the steps before/after the step of forming the barrier metal differ.

(1) One-step formation of $WSi_xN_y$ (plasma-less)

Figure 6A:
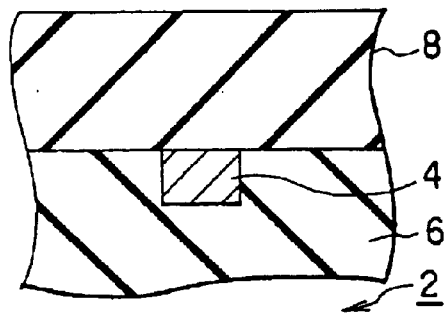
FIGS. 6A to 6F are views for use in explaining a Cu dual damashine process.
Figure 6B:
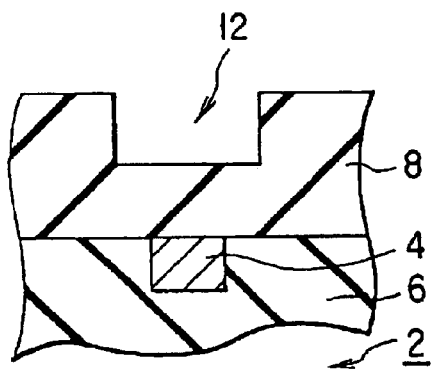

In the first place, a method of forming a $WSi_xN_y$ barrier metal in one step will be explained. Using another apparatus different from the processing apparatus shown in FIG. 5 and in accordance with a known method, a $SiO_2$ interlayer insulating film 8 is formed by SOG so as to cover the entire surface of the substrate 2 including a $SiO_2$ insulating layer 6 and a lower-layer wiring 4, as shown in FIG. 6(A). Subsequently, a wiring groove 12 is formed by etching in the interlayer insulating film 8 along a wiring pattern in accordance with a known method (FIG. 6(B)). Furthermore, a via-hole 10 is formed by etching at a predetermined portion of the wiring groove 12 to expose the lower-layer wiring 4 therein (FIG. 6(C)).

After processing is applied to the substrate 2, the substrate 2 is loaded into a processing apparatus shown in FIG. 4 to initiate the formation of the barrier metal.

After the substrate 2 is placed on the mounting pedestal 36 of the processing vessel 34, the processing vessel 34 is sealed airtight. The substrate 2 is maintained under a predetermined processing pressure and simultaneously a predetermined processing gas is introduced from the shower head portion 48 while the processing vessel 34 is vacuum-evacuated and maintained at a predetermined processing pressure. Under these conditions, a process for forming the barrier metal is carried out. By supplying $WF_6$ gas, $SiH_4$ gas, and MMH gas separately as processing gases and employing plasma-less thermal CVD (Chemical Vapor Deposition), the barrier metal 14 of the $WSi_xN_y$ film is formed at a stretch to a predetermined thickness in one step (FIG. 6(D)).

As the substrate 2, an 8-inch wafer is used herein. The processing gases, $WF_6$ gas, $SiH_4$ gas, and MMH gas are supplied at flow rates of about 2–20 sccm, 10–300 sccm, and 1–10 sccm, respectively. The processing temperature is about 300–450° C. The processing pressure is about 0.4–80

Torr. In the case where dichlorosilane is used in place of silane, the other gases are supplied at the same flow rates and the same processing pressure is employed but the processing temperature is about 550–650° C. Note that these numerical values mentioned about as well as the numerical values which will be described later are only examples, so that these numerical values may be appropriately changed in order to obtain the most suitable conditions.

If this method is employed, it is possible to form the barrier metal 14 in one step. As a result, the number of the steps can be reduced.

When the formation of the barrier metal 14 is completed in this method, for example, the substrate 2 is unloaded from the processing apparatus. Subsequently, metal copper is deposited on the surface of the substrate 2 as a wiring metal and by CVD (chemical Vapour Deposition) simultaneously fill the via-hole 10 and the wiring groove 12. In this manner, the via-hole 10 is filled with the via-hole plug 16A and the upper-layer wiring 16 is formed in the wiring groove 12 (FIG. 6(E)).

Note that the CVD processing of the metal copper may be carried out in the same processing apparatus as used in forming the barrier metal.

Subsequently, the substrate having the metal copper deposited thereon is taken out from the processing apparatus and subjected to CMP (Chemical Mechanical Polishing) to polish and remove unnecessary metal copper of the upper surface. The wiring pattern of the upper layer is thus formed (FIG. 6(F)). In this manner, the Cu dual damashine wiring is completed.

In this embodiment, MMH gas is used as a gas for use in mixing nitrogen atoms into the barrier metal 14. However, in place of this, $NH_3$ gas or $N_2$ gas may be used. If necessary, an inert gas such as Ar gas may be used as a carrier gas. In place of $SiH_4$ gas, dichlorosilane, disilane or the like may be used.

(2) One-Step Formation of $WN_x$ (Plasma-Less)

Then, we will explain a method of forming $WN_x$ barrier metal in one step. The same manner is employed in the steps except the step shown in FIG. 6(D), so that we will explain only the manner employed in the step shown in FIG. 6(D). In this case, the barrier metal 14 consisting of the $WN_x$ film is formed at a stretch to a predetermined thickness in one step by supplying $WF_6$ gas and MMH gas as processing gases and in accordance with the plasma-less thermal CVD method.

In the case of an 8-inch wafer, the processing gas, $WF_6$ gas is supplied at a flow rate of about 5–80 sccm and MMH gas at a flow rate of about 1–20 sccm. The processing temperature is about 300–450° C. and the processing pressure is about 0.5 to 80 Torr.

In this case, since only two types of processing gases are used, the structure of a gas supply system can be drastically simplified. Also in this case, needless to say, $NH_3$ gas or $N_2$ gas may be used in place of MMH gas.

(3) Two-Step Formation of $WSi_xN_y$

Figure 6C:
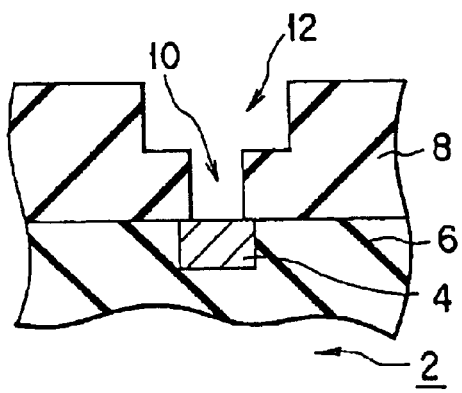
Figure 6D:
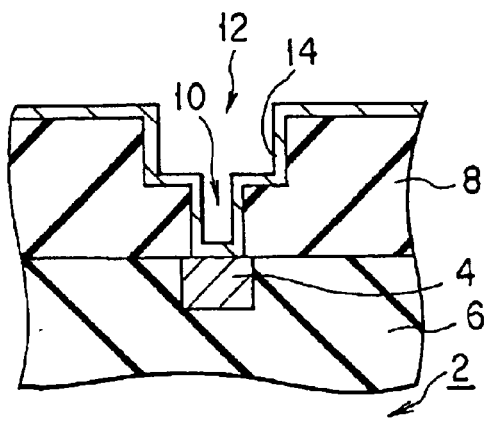
Figure 6E:
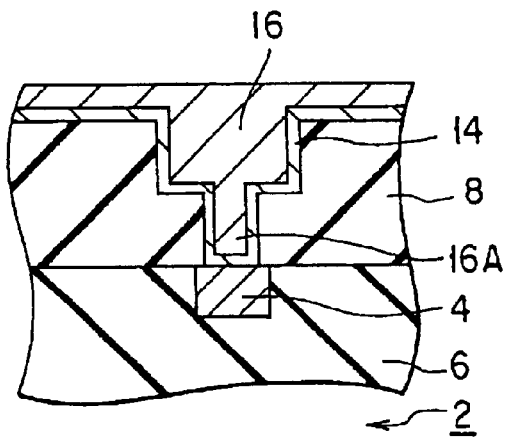
Figure 6F:
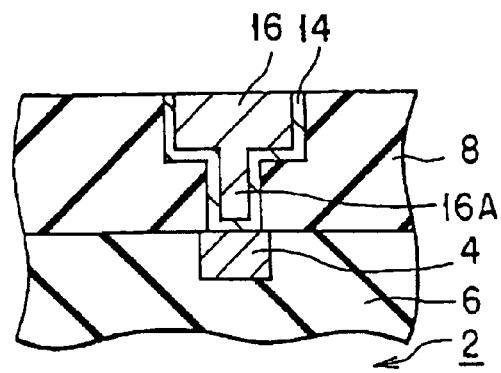

Then, we will explain a method of forming a $WSi_xN_y$ barrier metal in two steps. In this case, after the step shown in FIG. 6(C) is completed, the WSi layer is formed in the processing apparatus shown in FIG. 5. $WF_6$ gas and $SiH_4$ gas are used as the processing gases. The processing gases are supplied with or without using the carrier gas such as Ar gas to deposit the WSi film by plasma-less thermal CVD. The processing gas, $WF_6$ gas is supplied at a flow rate of about 2–80 sccm and $SiH_4$ gas is at about 5–40 sccm in the case of an 8-inch wafer. The processing temperature is about 300 to 450° C. The processing pressure is about 0.5 to 80 Torr. Needless to say, dichlorsilane, disilane, or the like may be used in place of $SiH_4$.

When the formation of the WSi film is thus completed, supply of $WF_6$ gas and $SiH_4$ gas is shut off and then, MMH gas is supplied to nitride the WSi film, with the result that the $WSi_xN_y$ barrier metal 14 is formed. At this time, the flow rate of the MMH gas is about 1 to 20 sccm. The processing temperature is about 300 to 450° C. The processing pressure is about 0.5 to 10 Torr. In this manner, the formation of the barrier metal 14 is completed. The nitriding is performed by using MMH gas herein because the processing can be made at a low temperature, so that a side reaction product is relatively rarely generated. It is therefore favorable to solve a problem with particles.

In this case, $NH_3$ gas or $N_2$ gas may be used in place of the MMH gas. Furthermore, it is preferable that the $WF_6$ gas be completely removed by purging $N_2$ gas into the processing vessel 34, between the film formation step and the nitriding step. In particular, when the $NH_3$ gas is used in place of the MMH gas in the nitriding step, if the $WF_6$ gas remains in the processing vessel, a side product, which is difficult to remove, is formed by the reaction between ammonia and fluoride gas. It is therefore preferred to completely remove the $WF_6$ gas before the nitriding process. When the $NH_3$ gas is used, the processing temperature is about 300 to 450° C.

In the case where $N_2$ gas is used in place of MMH gas, the switch 52 is turned on to apply a high frequency power between an upper electrode (shower head portion) 48 and a lower electrode (mounting table) 36. In this manner, a plasma is generated in the interior of the vessel to perform the nitriding process for the surface of WSi film. At this time, the supply amount of $N_2$ gas is about 50–300 sccm, the processing temperature is about 300 to 450° C., and the processing pressure is about 0.1 to 5 Torr (each of the conditions is for 8 inch wafer).

As described in the above, if two steps are carried out in the same processing apparatus, it is possible to cut down the time required for transferring of the water. As a result, the throughput can be improved. Needless to say, the film formation step and the nitriding step may be performed in discrete processing apparatuses.

(4) Two-Step Formation of $WN_x$

Then, we will explain a method of forming a $WN_x$ barrier metal in two steps. In this case, after the step shown in FIG. 6(C) is completed, a W layer is first formed in the apparatus shown in FIG. 5. At this time, $WF_6$ gas and $H_2$ gas are used as the processing gases to deposit the W film by the plasma-less thermal CVD. The flow rates of the processing gases, $WF_6$ gas and $H_2$ gas are about 5–100 scam and about 100–1000 scam. The processing temperature is about 300–450° C., the processing pressure is about 1 to 80 Torr.

When the formation of the W film is completed in this way, the supply of the $WF_6$ gas and the $H_2$ gas is shut off, and subsequently, MMH gas is supplied and thereby nitrides the W film to form the $WN_x$ barrier metal 14.

The flow rate of the MMH gas at this time is about 1–10 sccm, the processing temperature is about 300–450° C., and the processing pressure is about 0.1 to 5 Torr, in the case of an 8-inch wafer. In this manner, the formation of the barrier metal 14 is completed. The nitriding is performed by using MMH gas herein because the processing can be made at a low temperature, so that a side reaction product is relatively rarely generated. It is therefore favorable to solve a problem with particles.

In this case, NH$_3$ gas or N$_2$ gas may be used in place of MMH gas as explained in the above (3). Furthermore, it is preferable that the WF$_6$ gas be completely removed by purging N$_2$ gas into the processing vessel 34, between the film formation step and the nitriding step. In particular, when NH$_3$ gas is used in place of MMH gas in the nitriding step, if the WF$_6$ gas remains in the processing vessel, a side product, which is difficult to remove, is formed by the reaction between ammonia and fluoride gas. It is therefore preferred to completely remove the WF$_6$ gas before the nitriding process. When NH$_3$ gas is used, the processing temperature is about 300–450° C.

When N$_2$ gas is used in place of MMH gas, the switch 52 is turned on to apply a high frequency power between the upper electrode (shower head portion) 48 and the lower electrode (mounting table) 36. In this manner, a plasma is generated in the interior of the vessel to perform nitriding process for the surface of WSi film. At this time, the supply amount of N$_2$ gas is about 50–300 sccm, the processing temperature is about 300 to 450° C., and the processing pressure is about 0.1 to 5 Torr.

As described in the above, if two steps are carried out in the same processing apparatus, it is possible to cut down the time required for transferring of the water. As a result, the throughput is improved. Needless to say, the film formation step and the nitriding step may be performed in discrete processing apparatuses.

The barrier metal 14 formed by each of the aforementioned methods was checked for characteristics. As a result, it was confirmed that the barrier metal has sufficiently high barrier properties to oxygen atoms or silicon atoms.

Next, the gate electrode of the present invention and the method of forming the gate electrode will be explained.

Now, the gate electrode 28, which has been explained with reference to FIG. 3, will be explained more specifically. FIG. 7 is a magnified view of a part of the gate electrode shown in FIG. 3. We will explain the case in which tungsten nitride (WN$_x$) is used as the barrier metal 14 as an example. As explained in FIG. 3, a source 18 and a drain 19 are formed at both sides of the gate oxide film 26 over the substrate 2 such as a single crystalline silicon semiconductor wafer, as explained in FIG. 3. As the gate oxide film 26, a silicon oxide film (SiO$_2$) is used.

For example, a phosphorus-doped polysilicon layer 30 is formed in the different film formation apparatus as mentioned above and in accordance with a known method, and thereafter, the substrate W is loaded into the film formation apparatus as shown in FIG. 5.

The WN$_x$ film may be formed either by a single step using the aforementioned plasma-less CVD or by two-steps.

When the WN$_x$ film is formed in the single step, WF$_6$ gas and MMH gas are supplied as the processing gases to form the barrier metal of the WN$_x$ film on the polysilicon layer 30 at a predetermined thickness in accordance with the plasma-less thermal CVD. The processing gas, WF$_6$ gas is supplied at a flow rate of about 5–80 sccm and MMH gas at a flow rate of about 1–20 sccm, in the case of an 8-inch wafer. The processing temperature is about 300–450°C. and the processing pressure is about 0.5 to 80 Torr.

In this case, since the number of gas types is only two, the structure of the gas supply system can be drastically simplified. NH$_3$ gas or N$_2$ gas may be used in place of MMH gas.

In the case where the WN$_x$ film is formed in two steps, the W layer is first formed. At this time, WF$_6$ gas and H$_2$ gas are used as the processing gases to deposit the W film by the plasma-less thermal CVD. As the processing gas, WF$_6$ gas is supplied at a flow rate of about 5–100 sccm and H$_2$ gas at a flow rate of about 100–1000 sccm in the case of an 8-inch wafer. The processing temperature is about 300–450° C. and the processing pressure is about 1 to 80 Torr.

When the formation of the W film is thus completed, supply of WF$_6$ gas and H$_2$ gas is shut off. Subsequently, MMH gas is supplied to nitride the W film, to obtain the barrier metal 14 of WN$_x$. At this time, the flow rate of the MMH gas is about 1 to 10 sccm, the processing temperature is about 300 to 450° C., and the processing pressure is about 0.1 to 5 Torr. In this manner, the formation of the barrier metal 14 is completed. The nitriding is performed by using MMH gas herein because the processing can be made at a low temperature, so that a side reaction product is relatively rarely generated. It is therefore favorable to solve a problem with particles.

In this case, NH$_3$ gas or N$_2$ gas may be used in place of the MMH gas. Furthermore, it is preferable that the WF$_6$ gas be completely removed by purging N$_2$ gas into the processing vessel 34, between the film formation step and the nitriding step. In particular, when the NH$_3$ gas is used in place of the MMH gas in the nitriding step, if the WF$_6$ gas remains in the processing vessel, a side product, which is difficult to remove, is formed by the reaction between ammonia and fluoride gas. It is therefore preferred to completely remove the WF$_6$ gas before the nitriding process. When the NH$_3$ gas is used, the processing temperature is about 300 to 450° C.

After the WN$_x$ barrier metal 14 is thus formed in the single step or the two steps, an upper tungsten layer 32 is formed in the same processing vessel 34. The film formation conditions for the tungsten layer 32 are the same as in the film formation step of the W film performed before the WN$_x$ layer is formed in the two-step process previously mentioned. Using WF$_6$ gas and H$_2$ gas as the processing gases, the W film is deposited to a predetermined thickness in accordance with the plasma-less thermal CVD. At this time, a flow rate of the processing gas, WF$_6$ gas, is about 5–100 sccm and the H$_2$ gas about 100–1000 sccm. The processing temperature is about 300 to 450° C. The processing pressure is about 1 to 80 Torr. At this time, each of the layers is set such that a design rule for the memory corresponding to, for example, 1G bit capacity is used. More specifically, the gate oxide film 26 is about 20Å thick, the polysilicon layer 30 is about 500Å thick, the barrier metal 14 is 50Å thick and the metal layer (tungsten) layer 32 is 500Å thick.

The tungsten layer 32 is formed in this manner to thereby form the gate electrode 28. The barrier metal 14 and the tungsten layer 32 are made of the same metallic material, namely, tungsten, so that they are continuously formed in the same film formation apparatus. Therefore, the loading/unloading operation of the substrate is not required, with the result that the yield can be improved.

Since the WN$_x$ layer is used as the barrier metal in the polysilicon metal gate electrode, it is possible to obtain resistance at an extremely low value. In addition, adhesiveness and heat resistance between both layers can be maintained high and high barrier properties are exhibited. In particular, even if the barrier metal 14 is reduced in thickness up to about 50 Å, the sufficient barrier properties as mentioned above can be obtained. It is therefore possible to attain a thin-film and multi-layered semiconductor integrated circuit.

The gate electrode of the present invention and a conventional gate electrode generally used were checked for characteristics. The results are shown in FIG. 9.

In FIG. 9, Comparative Examples 1 and 2 show a conventional gate electrode. More specifically, Comparative Example 1 is the gate electrode formed of the polysilicon layer and the tungsten silicide layer. Comparative Example 2 is the gate electrode formed of the polysilicon layer and titanium silicide layer.

As is apparent from FIG. 9, the gate electrode of the present invention is excellent in both resistance value and heat resistance which are critical characteristics as the gate electrode. Furthermore, it is demonstrated that the gate electrode of the present invention is satisfactory in chemical resistance, that is, corrosiveness to hydrogen fluoride (HF), and in etching properties during the film formation. Note that the low etching property during the film formation means that the film thickness is controlled well. Therefore, it is possible to form a thin-film gate electrode can be formed with a high accuracy.

In contrast, in Comparative Example 1, heat resistance is good but a critical factor, resistance value, is considerably large. For this reason, Comparative Example 1 is not preferable. In Comparative Example 2, the resistance value is large and heat resistance is lower than the reference value of 850° C. For this reason, Comparative Example 2 is not preferable.

In the aforementioned embodiments, the case where $SiO_2$ is used as the gate oxide film 26 is explained as an example. However, the present invention is not limited to this. Tantalum oxide ($Ta_2O_5$) enabling a further reduction of the film thickness may be used as the gate oxide film 26.

FIG. 8 is a magnified sectional view of the gate electrode when $Ta_2O_5$ is used as the gate oxide film. In the case of the gate electrode shown in FIG. 8, a $WN_x$ barrier metal 14 is directly formed on the $Ta_2O_5$ gate oxide film 26 in place of using the polysilicon layer. On the barrier metal 14, the tungsten layer 32 is further formed.

The barrier metal 14 and the tungsten layer 32 are formed continuously in the same film formation apparatus, as shown in the above. Also, in this case, the $WN_x$ barrier metal 14 not only exhibits efficient barrier properties but also contributes to further reducing the thickness of the gate electrode 28 since the polysilicon layer is not used. The total thickness of the gate oxide film 26, barrier metal 14 and the tungsten layer 32 can be reduced up to, for example, about 1000 Å. As a result, a design rule of the memory of 4G bit capacity can be applied thereto.

Now, $WN_x$ and $WSi_xN_y$ used in the embodiments of the present invention can be cleaned with a gas including $ClF_3$ gas in the same manner as in other major films. If cleaning is performed every time a film is formed on the appropriate number of wafers, it is possible to suppress generation of particles to obtain a high-quality film.

In the aforementioned embodiments, the case where tungsten is used as a high-melting point metallic material, is explained as an example. The present invention is not limited to this. For example, molybdenum (Mo) may be used. Furthermore, in the aforementioned embodiments, the case where a semiconductor wafer is used as the substrate is explained as an example. However, the present invention is not limited to this. Needless to say, an LCD substrate and a glass substrate may be used.

What is claimed is:

1. A method of forming a barrier metal film formed of a nitride film including tungsten by thermal CVD, comprising:
   (a) positioning a substrate in a processing vessel;
   (b) forming a WSi film on one side of the substrate by supplying a process gas including $WF_6$ gas and at least one of $SiH_4$ gas, $SiH_2Cl_2$ gas and $Si_2H_6$ gas into the processing vessel while a processing pressure in the processing vessel is maintained;
   (c) shutting off the supplying of the process gas into the processing vessel;
   (d) completely removing the process gas from the processing vessel by supplying a purging gas into the processing vessel after the shutting off the supplying; and
   (e) nitriding the WSi film by supplying $NH_3$ gas or MMH gas into the processing vessel from which the process gas has been removed, to form a WSixNy film.

2. The method according to claim 1, wherein the nitriding of the WSi film is performed in another processing vessel.

3. The method according to claim 1, wherein the WSi film is formed at a temperature of about 300 to 450° C. and on a pressure of about 0.5 to 80 Torr.

4. The method according to claim 1, wherein the nitriding of the WSi film is performed by under the following process conditions:

temperature: about 300–450° C., and pressure: about 0.5–10 Torr.

5. A method of forming a barrier metal film by thermal CVD, comprising:
   (a) positioning a substrate in a processing vessel;
   (b) forming a film containing tungsten on one side of the substrate by supplying a process gas including a gas containing tungsten and a gas containing hydrogen into the processing vessel, while a processing pressure in the processing vessel is maintained;
   (c) shutting off the supplying of the process gas into the processing vessel;
   (d) removing the process gas from the processing vessel by supplying an inert gas as a purging gas into the processing vessel after the shutting off the supplying; and
   (e) nitriding the film containing tungsten by supplying $NH_3$ gas or MMH gas into the processing vessel from which the process gas has been removed, to form a nitrided film.

6. The method according to claim 5, wherein the nitriding of the film is performed by generating plasma.

7. The method according to claim 5, wherein the gas containing hydrogen includes at least one of $H_2$ gas, $SiH_4$ gas, $Si_2H_6$ gas, and $SiH_2Cl_2$ gas.

8. A method of forming a barrier metal film by thermal CVD comprising:
   (a) positioning a substrate in a processing vessel;
   (b) forming a W film on one side of the substrate by supplying a process gas including $WF_6$ gas and $H_2$ gas into the processing vessel while a processing pressure in the processing vessel is maintained;
   (c) shutting off the supplying of the process gas into the processing vessel;
   (d) removing the process gas from the processing vessel by supplying an inert gas as a purging gas into the processing vessel, after the shutting off the supplying; and
   (e) nitriding the W film by supplying a gas containing $NH_3$ gas or MMH gas into the processing vessel from which the process gas has been removed, to form a WNx film.

9. The method according to claim 8, wherein the film containing tungsten is formed at a temperature of about 300 to 450° C.

10. The method according to claim 8, wherein the W film is formed at a temperature of about 300 to 450° C.

11. The method according to claim 8, wherein the nitride of the W film is performed by using MMH gas under the following process conditions:

temperature: about 300–450° C., and pressure: about 0.5–10 Torr.

12. The method according to claim 8, wherein the W film is formed on a pressure of about 1 to 80 Torr.

13. A method of forming a barrier metal film by thermal CVD, comprising:

(a) positioning a substrate in a processing vessel;

(b) forming a film containing metal on one side of the substrate by supplying a process gas including a gas containing metal and a gas containing hydrogen into the processing vessel, while a processing pressure in the processing vessel is maintained by using plasma-less thermal CVD method;

(c) shutting off the supplying of the process gas into the processing vessel;

(d) removing the process gas from the processing vessel by supplying an inert gas as a purging gas into the processing vessel, after the shutting off the supplying; and (e) nitriding the film containing metal by supplying $NH_3$ gas into the processing vessel from which the process gas has been removed to form a nitrided film including metal.

14. The method according to claim 13, wherein the nitriding of the film containing metal is performed in another processing vessel.

15. The method according to claim 13, wherein said nitriding comprises supplying at least one of MMH and $N_2$.

16. The method according to claim 13, wherein the film containing metal is formed of a metal film or metal-silicide film.

* * * * *